US 6,548,858 B2

(12) United States Patent
Cheng

(10) Patent No.: US 6,548,858 B2
(45) Date of Patent: Apr. 15, 2003

(54) MULTI-LAYER CIRCUIT BOARD

(75) Inventor: Yu-Chiang Cheng, Taipei (TW)

(73) Assignee: Mitac International Corp., Hsinchu Hsien (TW)

( * ) Notice: Subject to any disclaimer, the term of this patent is extended or adjusted under 35 U.S.C. 154(b) by 0 days.

(21) Appl. No.: 09/800,409

(22) Filed: Mar. 6, 2001

(65) Prior Publication Data
US 2002/0153613 A1 Oct. 24, 2002

(51) Int. Cl.$^7$ .............................. H01L 29/792
(52) U.S. Cl. ................ 257/324; 257/700; 257/758; 174/255; 174/256; 29/830; 361/763
(58) Field of Search .................. 257/760, 700, 257/748, 758, 324; 174/255, 724, 261, 260, 256; 361/763; 29/830, 850, 852

(56) References Cited

U.S. PATENT DOCUMENTS

| | | | |
|---|---|---|---|
| 3,798,762 A | | 3/1974 | Harris et al. |
| 4,285,780 A | | 8/1981 | Schachter |
| 4,353,040 A | * | 10/1982 | Krumm et al. ............. 333/1 |
| 4,380,704 A | | 4/1983 | Wisda |
| 4,498,122 A | * | 2/1985 | Rainal ....................... 361/414 |
| 4,526,835 A | | 7/1985 | Takahashi et al. |
| 4,661,417 A | * | 4/1987 | Suzuki et al. ............. 428/607 |
| 4,675,789 A | | 6/1987 | Kuwabara et al. |
| 4,830,704 A | | 5/1989 | Voss et al. |
| 5,010,641 A | | 4/1991 | Sisler |
| 5,400,039 A | | 3/1995 | Araki et al. |
| 5,538,832 A | * | 7/1996 | Aoyama et al. ......... 430/281.1 |
| 5,569,390 A | | 10/1996 | Endo |
| 5,719,750 A | | 2/1998 | Iwane |
| 5,796,587 A | | 8/1998 | Lauffer et al. |
| 5,840,382 A | | 11/1998 | Nishide et al. |
| 5,912,809 A | | 6/1999 | Steigerwald et al. |
| 6,084,779 A | * | 7/2000 | Fang ........................ 174/255 |
| 6,103,977 A | * | 8/2000 | Namgung .................. 174/252 |
| 6,180,215 B1 | | 1/2001 | Sprietsma et al. |
| 6,191,475 B1 | | 2/2001 | Skinner et al. |
| 6,215,372 B1 | | 4/2001 | Novak |
| 6,229,095 B1 | | 5/2001 | Kobayashi |
| 6,261,467 B1 | | 7/2001 | Giri et al. |
| 6,326,557 B1 | | 12/2001 | Cheng |
| 6,384,340 B1 | | 5/2002 | Cheng |
| 6,417,460 B1 | | 7/2002 | Cheng |

* cited by examiner

Primary Examiner—David Nelms
Assistant Examiner—Long Tran
(74) Attorney, Agent, or Firm—Merchant & Gould P.C.

(57) ABSTRACT

A multi-layer circuit board includes first, second, third, fourth and fifth insulating substrates, first, second, third and fourth signal wiring layers, a ground wiring layer and a power wiring layer. The insulating substrates and the wiring layers are press-bonded to each other to form the circuit board with a thickness of about 1.0 mm. Each of the first and fifth insulating substrates has a thickness ranging from 5.225 to 5.775 mil. Each of the second and fourth insulating substrates has a thickness ranging from 7.6 to 8.4 mil. The third insulating substrate has a thickness ranging from 3.8 to 4.2 mil. The first signal wiring layer has a first resistance with respect to the ground wiring layer. The second signal wiring layer has a second resistance with respect to the ground wiring layer and the power wiring layer. The third signal wiring layer has a third resistance with respect to the ground wiring layer and the power wiring layer. The fourth signal wiring layer has a fourth resistance with respect to the power wiring layer. The first, second, third and fourth resistances are within the range of 49.5 to 60.5 ohms.

11 Claims, 2 Drawing Sheets

MULTI-LAYER CIRCUIT BOARD

BACKGROUND OF THE INVENTION

1. Field of the Invention

The invention relates to a multi-layer circuit board, more particularly to a multi-layer circuit board with a thickness of 1.0 mm, which can achieve impedance matching to result in reduced high speed signal reflection and reduced electromagnetic interference.

2. Description of the Related Art

FIG. 1 shows a conventional multi-layer circuit board with a thickness of about 1.0 mm. As shown, the conventional 1.0 mm multi-layer circuit board includes: first, second, third, fourth and fifth insulating substrates (A1), (A2), (A3), (A4) and (A5) disposed sequentially one above the other; a first signal wiring layer (S1) disposed on one side of the first insulating substrate (A1) opposite to the second insulating substrate (A2); a ground wiring layer (GND) disposed between the first and second insulating substrates (A1), (A2); a second signal wiring layer (S2) disposed between the second and third insulating substrates (A2), (A3); a third signal wiring layer (S3) disposed between the third and fourth insulating substrates (A3), (A4); a power wiring layer (PWR) disposed between the fourth and fifth insulating substrates (A4), (A5); and a fourth signal wiring layer (S4) disposed on one side of the fifth insulating substrate (A5) opposite to the fourth insulating substrate (A4). The first, second, third, fourth and fifth insulating substrates (A1), (A2), (A3), (A4) and (A5), the first, second, third and fourth signal wiring layers (S1), (S2), (S3) and (S4), the ground wiring layer (GNP) and the power wiring layer (PWR) are press-bonded to each other to form the conventional circuit board with a thickness of about 1.0 mm. The first and fourth signal wiring layers (S1), (S4) are adapted to be mounted with components thereon. Each of the first, third and fifth insulating substrates (A1), (A3), (A5) has a thickness of about 2.8 mil. Both of the second and fourth insulating substrates (A2), (A4) have a thickness of about 14 mil. Each of the first, third and fifth insulating substrates (A1), (A3), (A5) is made from a polyester prepreg. Each of the second and fourth insulating substrates (A2), (A4) is made from a fibrous core material that contains paper or glass fibers. In this structure, the first signal wiring layer (S1) has a first resistance (Rs1) with respect to the ground wiring layer (GND). The second signal wiring layer (S2) has a second resistance (Rs2) with respect to the ground wiring layer (GND) and the power wiring layer (PWR). The third signal wiring layer (S3) has a third resistance (Rs3) with respect to the ground wiring layer (GND) and the power wiring layer (PWR). The fourth signal wiring layer (S4) has a fourth resistance (Rs4) with respect to the power wiring layer (PWR). The first and fourth resistances (Rs1), (Rs4) are about 42 ohms. The second and third resistances (Rs2), (Rs3) are about 64 ohms. During layout, electrical connections pass through the wiring layers and the insulating substrates. Such a conventional circuit board structure has certain drawbacks, which are set forth as follows:

(1) Serious reflection during high speed signal transmission: According to the standard theoretical values determined by Intel, the resistance between two adjacent wiring layers for a circuit board during high speed signal transmission is preferably within the range of 55±10%Ω, i.e., between 49.5 Ω and 60.5 Ω. However, the resistances of the conventional circuit board fall outside the preferable range recommended by Intel. In addition, there is a difference of 22 ohms between the value of the first and fourth resistances (Rs1), (Rs4) and that of the second and third resistances (Rs2), (Rs3). Such a large difference will result in an impedance mismatch. Thus, when a high speed signal is being transmitted through the conventional circuit board and passes from the first or fourth signal wiring layer (S1) or (S4) to the second or third signal wiring layer (S2) or (S3), reflection of the signal will result. The reflection index of the high-speed signal can be calculated as:

$$\rho = \frac{Zl - Zo}{Zl + Zo} = \frac{Rs1 - Rs2}{Rs1 + Rs2} = 0.208$$

When the reflection is serious, the waveform will be distorted considerably, thereby resulting in poor signal quality. In view of the aforesaid, the conventional 1.0-mm multi-layer circuit board is not suited for high speed signal transmission.

(2) Weakened magnetic flux counteraction: As reflection of high speed signals will generate standing waves, which will increase electromagnetic radiation of the high speed signal, the magnetic flux counteraction of the circuit board is weakened, thereby resulting in excessively high electromagnetic interference.

SUMMARY OF THE INVENTION

Therefore, the main object of the present invention is to provide a multi-layer circuit board with a thickness of 1.0 mm, which can achieve impedance matching to result in reduced high speed signal reflection and reduced electromagnetic interference.

Accordingly, a multi-layer circuit board of this invention includes: first, second, third, fourth and fifth insulating substrates disposed sequentially one above the other; a first signal wiring layer disposed on one side of the first insulating substrate opposite to the second insulating substrate; a ground wiring layer disposed between the first and second insulating substrates; a second signal wiring layer disposed between the second and third insulating substrates; a third signal wiring layer disposed between the third and fourth insulating substrates; a power wiring layer disposed between the fourth and fifth insulating substrates; and a fourth signal wiring layer disposed on one side of the fifth insulating substrate opposite to the fourth insulating substrate. The first, second, third, fourth and fifth insulating substrates, the first, second, third and fourth signal wiring layers, the ground wiring layer and the power wiring layer are press-bonded to each other to form the circuit board with a thickness of about 1.0 mm. Each of the first and fifth insulating substrates has a thickness ranging from 5.225 to 5.775 mil. Each of the second and fourth insulating substrates has a thickness ranging from 7.6 to 8.4 mil. The third insulating substrate has a thickness ranging from 3.8 to 4.2 mil. The first signal wiring layer has a first resistance with respect to the ground wiring layer. The second signal wiring layer has a second resistance with respect to the ground wiring layer and the power wiring layer. The third signal wiring layer has a third resistance with respect to the ground wiring layer and the power wiring layer. The fourth signal wiring layer has a fourth resistance with respect to the power wiring layer. The first, second, third and fourth resistances are within the range of 49.5 to 60.5 ohms.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
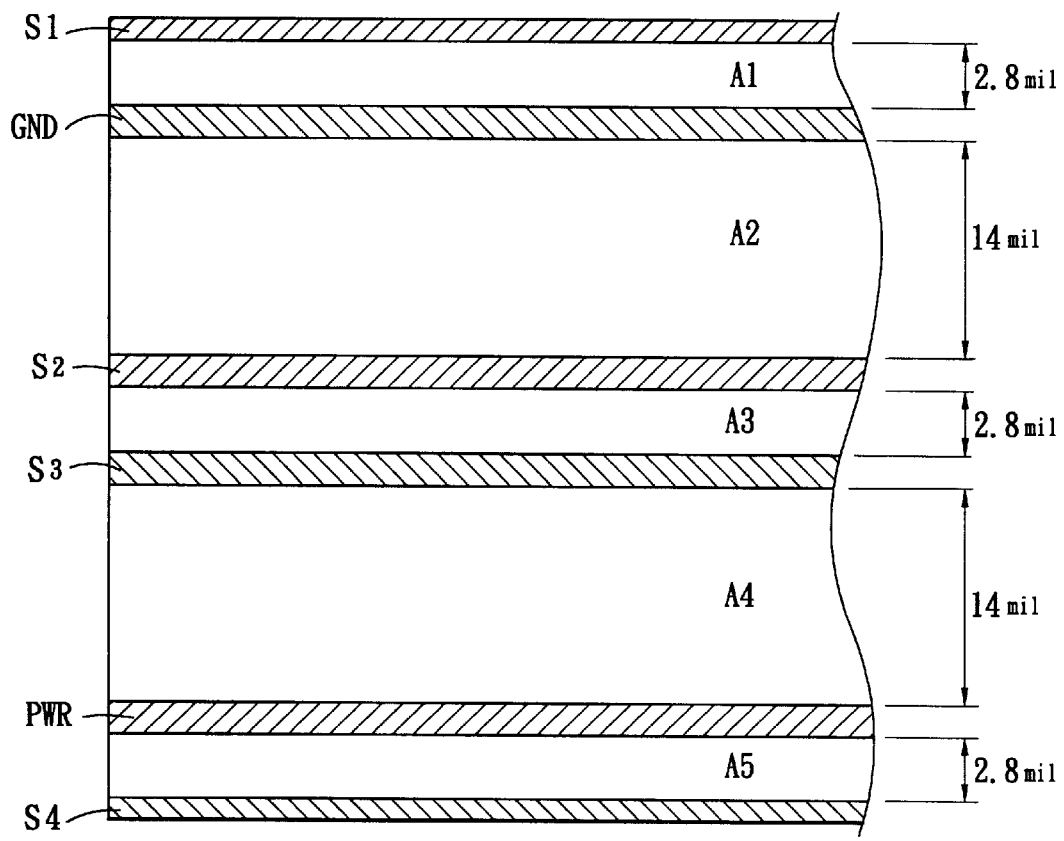
FIG. 1 is a schematic view of a conventional multi-layer circuit board with a thickness of about 1.0 mm.
Figure 2:
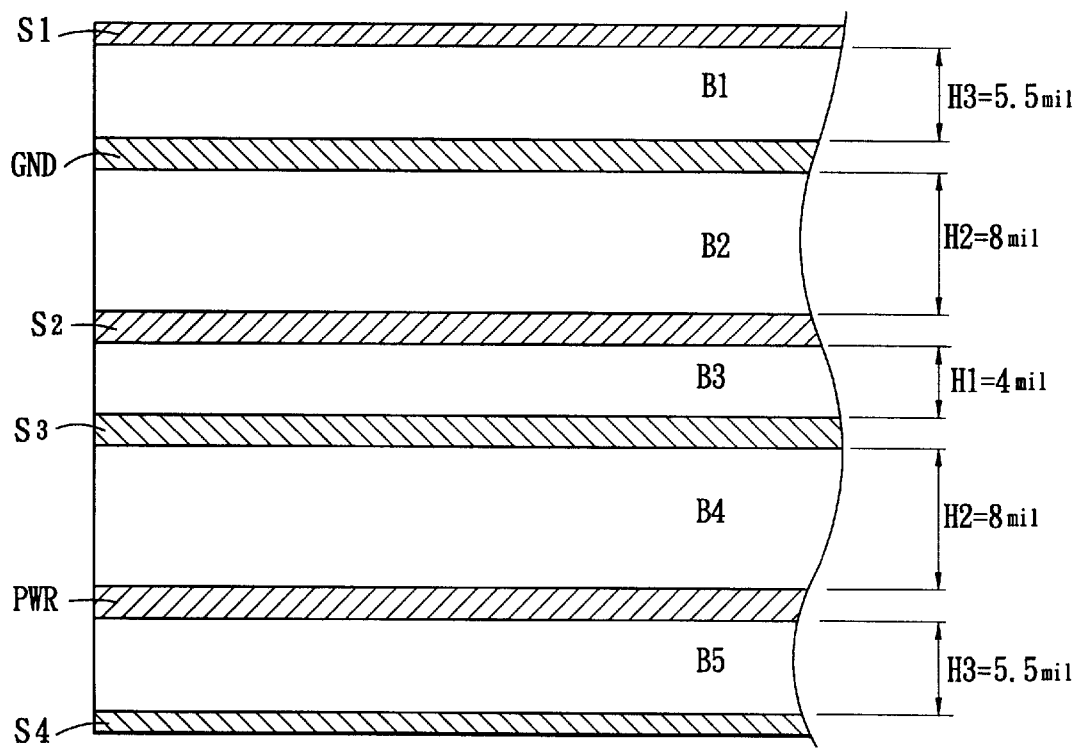
FIG. 2 is a schematic view of the preferred embodiment of a multi-layer circuit board according to the present invention.

Referring to FIG. 2, the preferred embodiment of a multi-layer circuit board according to the present invention is shown to include: first, second, third, fourth and fifth insulating substrates (B1), (B2), (B3) (B4) and (B5) disposed sequentially one above the other; a first signal wiring layer (S1) disposed on one side of the first insulating substrate (B1) opposite to the second insulating substrate (B2); a ground wiring layer (GND) disposed between the first and second insulating substrates (B1), (B2); a second signal wiring layer (S2) disposed between the second and third insulating substrates (B2), (B3); a third signal wiring layer (S3) disposed between the third and fourth insulating substrates (B3), (B4); a power wiring layer (PWR) disposed between the fourth and fifth insulating substrates (B4), (B5); and a fourth signal wiring layer (S4) disposed on one side of the fifth insulating substrate (B5) opposite to the fourth insulating substrate (B4). The first and fourth signal wiring layers (S1), (S4) are adapted to be mounted with components thereon.

The first, second, third, fourth and fifth insulating substrates (B1), (B2), (B3), (B4) and (B5), the first, second, third and fourth signal wiring layers (S1), (S2), (S3) and (S4), the ground wiring layer (GND) and the power wiring layer (PWR) are press-bonded to each other to form the circuit board with a thickness of about 1.0 mm. During press-bonding of the circuit board, the second and third signal wiring layers (S2), (S3) are disposed to sandwich the third insulating substrate (B3). The ground wiring layer (GND) and the second signal wiring layer (S2), and the third signal wiring layer (S3) and the power wiring layer (PWR) are disposed to sandwich the second and fourth insulating substrates (B2), (B4), respectively. Finally, the first and fourth signal wiring layers (S1), (S4) are respectively disposed to sandwich the assembly.

According to the present invention, each of the first and fifth insulating substrates (B1), (B5) has a thickness ranging from 5.225 to 5.775 mil. Each of the second and fourth insulating substrates (B2), (B4) has a thickness ranging from 7.6 to 8.4 mil. The third insulating substrate (B3) has a thickness ranging from 3.8 to 4.2 mil. The first signal wiring layer (S1) has a first resistance (Rs1) with respect to the ground wiring layer (GND). The second signal wiring layer (S2) has a second resistance (Rs2) with respect to the ground wiring layer (GND) and the power wiring layer (PWR). The third signal wiring layer (S3) has a third resistance (Rs3) with respect to the ground wiring layer (GND) and the power wiring layer (PWR). The fourth signal wiring layer (S4) has a fourth resistance (Rs4) with respect to the power wiring layer (PWR). With the thicknesses of the insulating substrates (B1), (B2), (B3), (B4) and (B5) controlled to be within the aforesaid ranges, the first, second, third and fourth resistances (Rs1), (Rs2), (Rs3) and (Rs4) can be kept within the range of 49.5 to 60.5 ohms. At least one of the first, third and fifth insulating substrates (B1) (B3), (B5) is made from a polyester prepreg. At least one of the second and fourth insulating substrates (B2), (B4) is made from a fibrous core material that contains paper fibers or glass fibers. In the preferred embodiment, the thicknesses of the first and fifth insulating substrates (B1), (B5) are equal. The thicknesses of the second and fourth insulating substrates (B2), (B4) are equal. Each of the first and fourth signal wiring layers (S1), (S4) has a thickness of about 0.7 mil. Each of the second and third signal wiring layers (S2), (S3), the ground wiring layer (GND) and the power wiring layer (PWR) has a thickness of about 1.4 mil. In addition, the first, second, third and fourth resistances (Rs1), (Rs2), (Rs3) and (Rs4) are desired to be substantially equal.

The value of the first and fourth resistance (Rs1), (Rs4) is calculated using the following formula (1):

$$R1 = \frac{87}{\sqrt{E_R + 1.41}} \ln\left(\frac{5.98H3}{0.8W + T1}\right) \quad (1)$$

wherein $E_R$ is the dielectric coefficient of the insulating substrate and is equal to 4.5; H3 is the thickness of the first and fifth insulating substrates (B1), (B5); W is the width of traces of the first and fourth signal wiring layers (S1) (S4) and is equal to 6 mil; and T1 is the thickness of the first and fourth signal wiring layers (S1), (S4) and is equal to 0.7 mil.

Likewise, the value of resistances (Rs2) and (Rs3) can be obtained using the following formulas (2) to (4):

$$R2 = \frac{2YZ}{Y+Z} \quad (2)$$

$$Y = \frac{60}{\sqrt{ER}} \ln\left\{\frac{8H2}{0.67\pi W\left(0.8 + \frac{T2}{W}\right)}\right\} \quad (3)$$

$$Z = \frac{60}{\sqrt{ER}} \ln\left\{\frac{8(H2 + H1)}{0.67\pi W\left(0.8 + \frac{T2}{W}\right)}\right\} \quad (4)$$

wherein $E_R$ is the dielectric coefficient and is equal to 4.5; H2 is the thickness of the second and fourth insulating substrates (B2), (B4); H1 is the thickness of the third insulating substrate (B3); T2 is the thickness of the second and third signal wiring layers (S2), (S3) and is equal to 1.4 mil; and W is the thickness of traces of the second and third signal wiring layers (S2), (S3) and is equal to 6 mil.

$$2H3 + 2H2 + 1H1 + 2T1 + 4T2 \approx 38 \text{ mil} \quad (5)$$

In addition, the total thickness of the circuit board should be equal to 1.0 mm (equiv. to 38 mil) or within a tolerance range thereof. By a trial-and-error process, the optimum values for H1, H2 and H3 can be obtained based on Formula 5. When H1, the thickness of the third insulating substrate (B3), is within the aforesaid preferred range of 3.8 to 4.2 mil, H1 is preferably equal to 4 mil. When H2, the thickness of the second and fourth insulating substrates (B2), (B4), is within the aforesaid preferred range of 7.6 to 8.4 mil, H2 is preferably equal to 8 mil. When H3, the thickness of the first and fifth insulating substrates (B1), (B5) is within the aforesaid preferred range of 5.225 to 5.775 mil, H3 is preferably equal to 5.5 mil. As such, the first resistance (Rs1) is equal to the fourth resistance (Rs4) and is equal to 48 ohms. The second resistance (Rs2) is equal to the third resistance (Rs3) and is equal to 48 ohms. The total thickness of the circuit board of the invention is $$2H3+2H2+1H1+2T1+4T2=2\times5.5 \text{ mil}+2\times8 \text{ mil}+1\times4 \text{ mil}+2\times0.7 \text{ mil}+4\times1.4 \text{ mil}=38 \text{ mil}\approx1.0 \text{ mm (within tolerance range)}$$

By virtue of the construction of the preferred embodiment, the following effects can be achieved:

(1) Reduced reflection during high speed signal transmission: Since the first, second, third and fourth resistances are substantially equal, the reflection index is zero. As reflection can be considerably reduced, the circuit board of this invention is suited for high speed signal transmission.

(2) Reduced electromagnetic interference: As the amount of reflection can be considerably reduced, standing waves will not be generated. Therefore, magnetic flux counteraction can be enhanced to comply with EMI requirements.

(3) During the process of layout, since the resistances are substantially equal, there is impedance matching. Thus, resistance control can be achieved without the need to alter the width of the traces of the wiring layers.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A multi-layer circuit board comprising:
   first, second, third, fourth and fifth insulating substrates disposed sequentially one above the other;
   a first signal wiring layer disposed on one side of said first insulating substrate opposite to said second insulating substrate;
   a ground wiring layer disposed between said first and second insulating substrates;
   a second signal wiring layer disposed between said second and third insulating substrates;
   a third signal wiring layer disposed between said third and fourth insulating substrates;
   a power wiring layer disposed between said fourth and fifth insulating substrates; and
   a fourth signal wiring layer disposed on one side of said fifth insulating substrate opposite to said fourth insulating substrate;
   wherein said first, second, third, fourth and fifth insulating substrates, said first, second, third and fourth signal wiring layers, said ground wiring layer and said power wiring layer are press-bonded to each other to form said circuit board with a thickness of about 1.0 mm;
   wherein each of said first and fifth insulating substrates has a thickness ranging from 5.225 to 5.775 mil;
   wherein each of said second and fourth insulating substrates has a thickness ranging from 7.6 to 8.4 mil;
   wherein said third insulating substrate has a thickness ranging from 3.8 to 4.2 mil;
   wherein said first signal wiring layer has a first resistance with respect to said ground wiring layer, said second signal wiring layer having a second resistance with respect to said ground wiring layer and said power wiring layer, said third signal wiring layer having a third resistance with respect to said ground wiring layer and said power wiring layer, said fourth signal wiring layer having a fourth resistance with respect to said power wiring layer; and
   wherein said first, second, third and fourth resistances are within the range of 49.5 to 60.5 ohms.

2. The multi-layer circuit board of claim 1, wherein at least one of said first, third and fifth insulating substrates is made from a polyester prepreg.

3. The multi-layer circuit board of claim 1, wherein at least one of said second and fourth insulating substrates is made from a fibrous core material.

4. The multi-layer circuit board of claim 3, wherein the core material contains paper fibers.

5. The multi-layer circuit board of claim 3, wherein the core material contains glass fibers.

6. The multi-layer circuit board of claim 1, wherein the thickness of said first and fifth insulating substrates are equal.

7. The multi-layer circuit board of claim 1, wherein the thickness of said second and fourth insulating substrates are equal.

8. The multi-layer circuit board of claim 1, wherein:
   each of said first and fourth signal wiring layers has a thickness of about 0.7 mil; and
   each of said second and third signal wiring layers, said ground wiring layer and said power wiring layer has a thickness of about 1.4 mil.

9. A multi-layer circuit board comprising:
   first, second, third, fourth and fifth insulating substrates disposed sequentially one above the other, at least one of said first, third and fifth insulating substrates is made from a first insulating material and at least one of said second and fourth insulating substrates is made from a second insulating material different from said first insulating material;
   a first signal wiring layer disposed on one side of said first insulating substrate opposite of said second insulating substrate;
   a ground wiring layer disposed between said first and second insulating substrates;
   a second signal wiring layer disposed between said second and third insulating substrates;
   a third signal wiring layer disposed between said third and fourth insulating substrates;
   a power wiring layer disposed between said fourth and fifth insulating substrates; and
   a fourth signal wiring layer disposed on one side of said fifth insulating substrate opposite of said fourth insulating substrate;
   wherein said first, second, third, fourth and fifth insulating substrates, said first, second, third and fourth signal wiring layers, said ground wiring layer and said power wiring layer are press-bonded to each other to form said circuit board with a thickness of about 1.0 mm;
   wherein each of said first and fifth insulating substrates has a thickness ranging from 5.225 to 5.775 mil;
   wherein each of said second and fourth insulating substrates has a thickness ranging from 7.6 to 8.4 mil;
   wherein said third insulating substrate has a thickness ranging from 3.8 to 4.2 mil;
   wherein said first signal wiring layer has a first resistance with respect to said ground wiring layer, said second signal wiring layer having a second resistance with respect to said ground wiring layer and said power wiring layer, said third signal wiring layer having a third resistance with respect to said ground wiring layer and said power wiring layer, said fourth signal wiring layer having a fourth resistance with respect to said power wiring layer; and wherein said first, second, third and fourth resistances are within the range of 49.0 to 60.5 ohms.

10. The multi-layer circuit board of claim 9, wherein said first insulating material is a polyester prepreg material.

11. The multi-layer circuit board of claim 9, wherein said second insulating material is a fibrous core material.

* * * * *